United States Patent [19]

Sato et al.

[11] Patent Number: 5,323,032
[45] Date of Patent: Jun. 21, 1994

[54] DUAL LAYER EPITAXTIAL BASE HETEROJUNCTION BIPOLAR TRANSISTOR

[75] Inventors: Fumihiko Sato; Tsutomu Tashiro, both of Tokyo, Japan

[73] Assignee: NEC Corporation, Tokyo, Japan

[21] Appl. No.: 941,723

[22] Filed: Sep. 8, 1992

[30] Foreign Application Priority Data

Sep. 5, 1991 [JP] Japan .................. 3-225552

[51] Int. Cl.$^5$ ................. H01L 29/161; H01L 29/205; H01L 29/225
[52] U.S. Cl. ................... 257/198; 257/592; 257/588
[58] Field of Search ............. 257/190, 197, 552, 592, 257/587, 588, 198

[56] References Cited

U.S. PATENT DOCUMENTS

| | | | |
|---|---|---|---|
| 5,117,271 | 5/1992 | Comfort et al. | 257/588 |
| 5,140,400 | 8/1992 | Morishita | 257/197 |
| 5,177,583 | 1/1993 | Endo et al. | 257/190 |

FOREIGN PATENT DOCUMENTS

| | | | |
|---|---|---|---|
| 63-211674 | 9/1988 | Japan | 257/197 |
| 267732 | 3/1990 | Japan | 257/588 |

OTHER PUBLICATIONS

"$Ge_x Si_{l-x}$ Stained-Layer Heterostructure Bipolar Transistors"; H. Temkin et al., Nov. 1987, pp. 1089–1091.

"Highly Planar Polysilicon-Base Transistor with Low Metal Land Capacitance"; IBM Technical Disclosure Bulletin; vol. 27, No. 10A; pp. 5790–5794, Mar., 1985.

"Sub-30-ps ECL Circuit Operation at Liquid-Nitrogen Temperature Using Self-Aligned Epitaxial SiGe-Base Bipolar Transistor", John D. Cressler et al., *IEEE Electron Device Letters*, vol. 12, No. 4, Apr. 1991, pp. 166–168.

"The Effect of Base-Emitter Spacers and Strain-Dependent Densities of States In $Si/Si_{1-x}Ge_x/Si$ Heterojunction Bipolar Transistors", E. J. Prinz et al., *IEEE*, 1989, pp. 27.1.1–27.1.4.

*Primary Examiner*—Jerome Jackson
*Assistant Examiner*—John Guay
*Attorney, Agent, or Firm*—Burns, Doane, Swecker & Mathis

[57] ABSTRACT

A Si-SiGe-Si heterojunction bipolar transistor which has a very thin epitaxial base layer. The device possesses an optimum doping profile across a base layer. The emitter region is higher doping concentration of n+-type. The base layer of p-type comprises both a monocrystalline SiGe layer having a lightly doped region on a collector side and a heavily doped region, and a lightly doped monocrystalline Si layer on an emitter side. An emitter side Si-SiGe heterojunction exists in the base layer and a collector side Si-SiGe heterojunction exists in the collector region. Those provides a slope negative gradient of a potential profile from the emitter to collector without a potential barrier for carriers, or electrons or holes. The very thin base layer is connected to an aluminium contact through an external base layer and a base contact layer thereby permitting the very thin base layer to be free from a damage by contacting with a metal such as aluminium. In replacement of this, the base layer may be formed thereunder with a base contact layer to cover the damage of the base layer.

17 Claims, 19 Drawing Sheets

DUAL LAYER EPITAXIAL BASE HETEROJUNCTION BIPOLAR TRANSISTOR

BACKGROUND OF THE INVENTION

The invention relates to an epitaxial base heterojunction bipolar transistor and a method of fabricating the same.

Epitaxial SiGe-base bipolar transistors have been known in the art as disclosed in IEEE Electron Devices Letters, Vol. 12, No. 4, April 1991 pp166-168 John D. Cressler, at al. "Sub-30-ps ECL Circuit Operation at Liquid-Nitrogen Temperature Using Self-Aligned Epitaxial SiGe-Base Bipolar Transistors".

FIG. 1 illustrates a structure of the conventional self-aligned epitaxial SiGe-base bipolar transistor. The conventional bipolar transistor has a $p^-$-type silicon substrate 1. An $n^+$-type buried layer 2 is formed on the $p^-$-type silicon substrate 1. The $p^-$-type silicon substrate 1 and the $n^+$-type buried layer 2 include two deep trench isolation regions containing polycrystalline silicon regions 21. The trench isolation regions are closed at those bottoms by channel stopper $p^+$-type layers 3 respectively. The trench isolations are covered with a silicon oxide layer 5 formed by the normal process such as the selective oxidization. The $n^+$-type buried layer 2 is connected to a collector contact through an contact hole in the silicon oxide layer 5. The silicon oxide layer 5 surrounds an n-type silicon region 4 which serves as a collector region.

The transistor has a $p^+$-type SiGe epitaxial base layer 7 which is deposited by using an ultrahigh-vacuum chemical vapor deposition low-temperature epitaxy. Thin lightly doped spacer layers (not shown) are formed at both the emitter and collector sides of the base layer 7 to decrease junction fields and parasitic capacity. The epitaxial base layer 7 formed by using the low-temperature epitaxy has a small thickness thereby providing high gain at low temperature while a cut-off frequency $f_T$ of the device is improved. The epitaxial base layer 7 permits minimizing a gate delay. The base layer 7 is made to directly contact with a base contact made of metals such as an aluminum system.

The transistor has an $n^+$-type polycrystalline silicon region 13 on the epitaxial base layer 7. The $n^+$-type polycrystalline silicon region 13 serves as an emitter region. The $n^+$-type polycrystalline silicon region 13 is surrounded by the silicon oxide region. An emitter contact is provided on the $n^+$-type polycrystalline silicon region 13.

FIG. 2 illustrates final vertical profiles of dopant concentrations in the $n^+$-type polycrystalline silicon region 13 serving as the emitter region and the epitaxial base layer 7 as well as the mole-percent of germanium in the epitaxial base region 7. The profile data is obtained by secondary ion mass spectrometry (SIMS) analysis. The base width is approximately 59 nm with a peak germanium concentration of approximately 9 percent. The emitter-base p-n junction exists in the vicinity of the heterojunction.

Such heterojunction bipolar transistors (HBT) are, however, engaged with disadvantages such as a formation of a parasitic electron barrier which effectively affects the transport of electrons across the epitaxial base layer 7. For instance, heterojunction bipolar transistors of III-V group heterojunction such as AlGaAs/GaAs are subjected to no heat treatment for diffusion after a crystal growth by using a molecular beam epitaxy or the like because a heat treatment is undesirable for such AlGaAs/GaAs.

In contrast, a silicon based heterojunction bipolar transistor such as a SiGe heterojunction bipolar transistor including a polycrystalline emitter possesses a good common-emitter current gain $h_{FE}$. Such a transistor requires a heat treatment for impurity diffusion from polycrystalline silicon to monocrystalline silicon. This results in a sufficiently high current gain $h_{FE}$ which provides a sufficiently small emitter charge/discharge time thereby permitting such transistor to have the high cut-off frequency $f_T$ as compared with a transistor having the same thickness base.

It is, however, considerable that the difference between thermal diffusion rates of boron and germanium is very large, typically two digits. This permits the out-diffusion of boron which causes potential barriers at the emitter collector sides of the base layer 7. The p-n junctions at the emitter and collector sides of the base layer 7 exist in the silicon regions respectively. Especially, the transport of minority carriers, or holes are substantially affected by the out-diffusion. The effects of the out-diffusion of boron on the device performance are disclosed in IEEE Technical Digest of IEDM (1989) p639.

The conventional device is engaged with following disadvantages. The device may have uneven heat distributions within a wafer during the heat treatment for dopant diffusion and uneven thickness of the base layer by the epitaxial growth. The p-n junction position of the emitter side may, therefore, be varied through the heterojunction of silicon and silicon germanium. This result is that the base emitter voltage VBE for a constant collector current is also variable.

SUMMARY OF THE INVENTION

Accordingly, it is a primary object of the present invention to provide an improved very thin epitaxial base heterojunction bipolar transistor possessing optimum dopant profiles across a base layer.

It is another object of the present invention to provide a novel base contact structure for an improved very thin epitaxial base in a heterojunction bipolar transistor.

The above and other objects, features, and advantages of the present invention will be apparent from following description.

In a novel heterojunction bipolar transistor according to the present invention, an emitter region of silicon is heavily doped with a first conductive type dopant. A base layer is doped with a second conductive type dopant. The base layer includes both a first layer made of a mixed monocrystalline silicon germanium alloy and a second layer made of monocrystalline silicon in which the second layer contacts with the emitter region. A collector region of monocrystalline silicon is doped with a first conductive type dopant. The collector region comprises an island region selectively formed in a silicon monocrystalline substrate. The collector region is also in contact with the first layer in the base layer.

The emitter side heterojunction of silicon and silicon germanium exists in the base layer. The collector side heterojunction of silicon and silicon germanium exists in the collector region. Those provide a negative slope gradient of a potential profile from the emitter region to the collector region. There is then no potential barrier undesirable for carriers, electrons or holes.

Further, the first layer in the base layer includes a higher dopant concentration region at an emitter side and a lower dopant concentration region at a collector side. The second layer of the base layer has a lower dopant concentration than that of the higher dopant concentration region of the first layer. The collector region includes a third layer made of a mixed monocrystalline silicon germanium alloy at a surface region thereof. The third layer is doped with the first conductive type dopant. The emitter region is formed in a surface of the base layer. The emitter is connected to an emitter contact made of aluminum through an emitter contact layer of polycrystalline silicon. A base contact layer of silicon doped with a second conductive type dopant is formed in a surface of the collector region. The base contact layer exists at least directly under a base contact made of aluminum through the base layer.

In replacement of the above structure, a following structure is also available. The device further includes following elements. An external base layer is provided on the base layer. The external base layer is doped with the second conductive type dopant. A base contact layer is provided on the external base layer. The base contact layer is doped with the second conductive type dopant. A base contact made of aluminum is provided on the base contact layer. A first insulation layer covers the collector region so as to separate the base contact layer from the collector region. A second insulation layer surrounds the emitter region so as to separate the emitter region from the base contact layer.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

A first embodiment of the present invention will now be described with referring to FIGS. 3 to 8.

Figure 1:
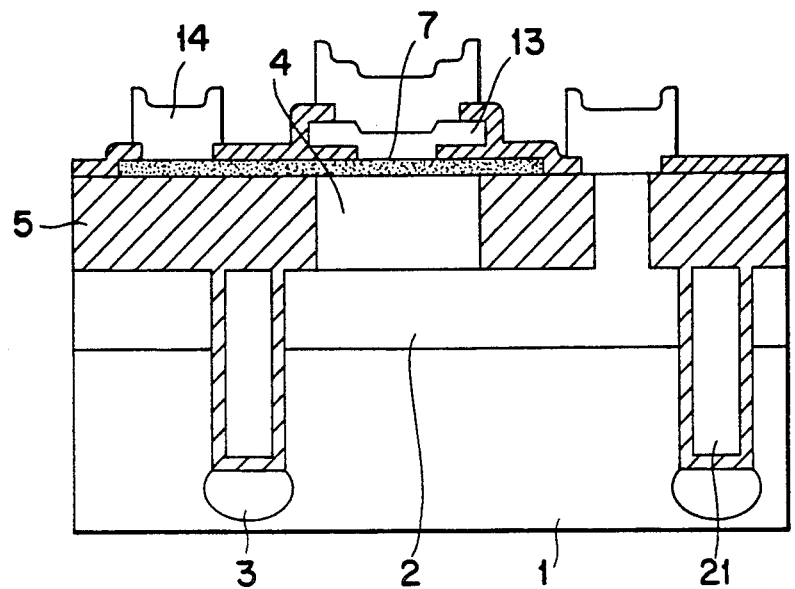
FIG. 1 is a fragmentary cross sectional elevation view illustrative of the conventional self-aligned epitaxial SiGe base heterojunction bipolar transistor.
Figure 2:
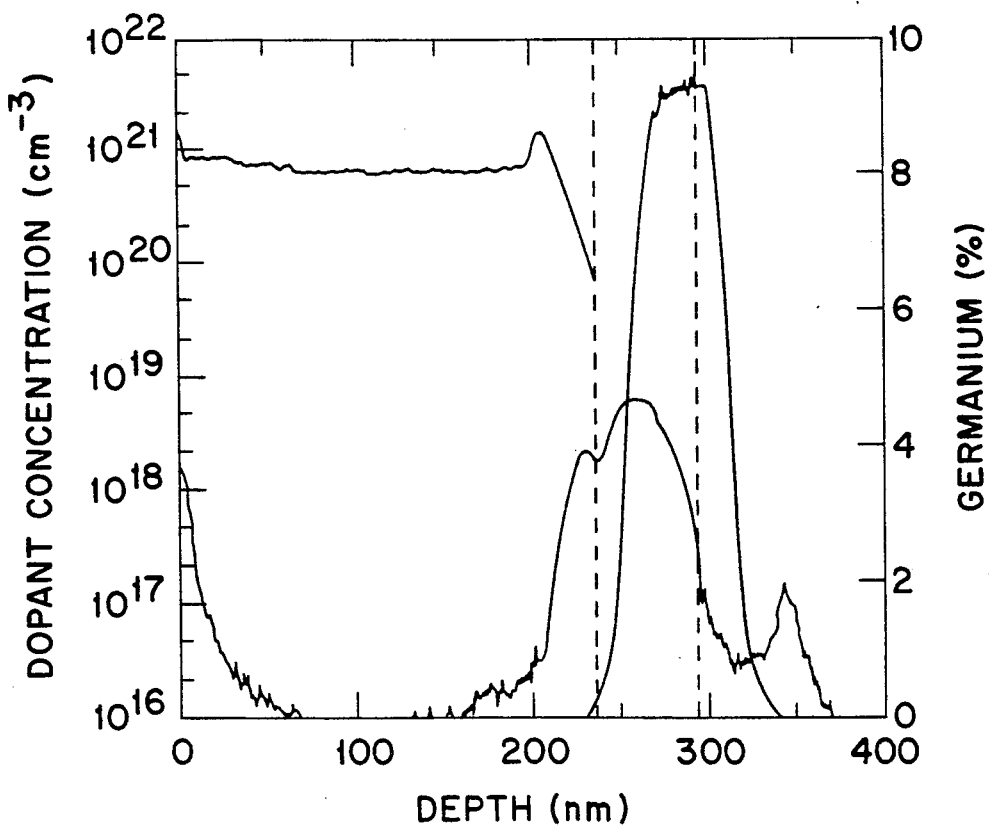
FIG. 2 is a diagram illustrative of the dopant profiles in the base-emitter regions and the mole-percent of germanium in the conventional device of FIG. 1.
Figure 3:
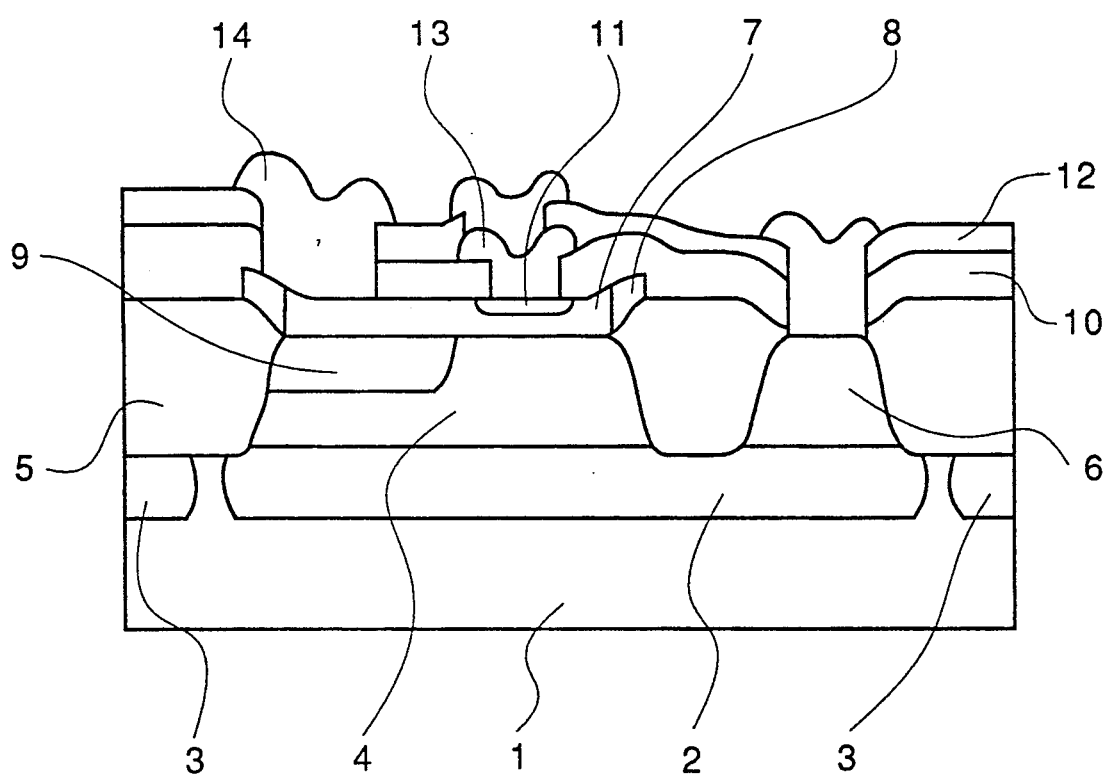
FIG. 3 is a fragmentary cross sectional elevation view illustrative of a novel non-self-aligned epitaxial intrinsic base heterojunction bipolar transistor of a first embodiment according to the present invention.

Referring to FIG. 3, the device includes a $p^-$-type silicon substrate 1 which possesses a resistivity of 10 to 20 ohms cm at a room temperature and has a plane (100). The $p^-$-type silicon substrate 1 is provided at its upper portion with an $n^+$-type buried layer 2 which is subjected to doping and diffusion of arsenic. The $p^-$-type silicon substrate 1 is also provided at its upper portion with a $p^+$-type buried layer 3 which serves as a channel stopper. The $n^+$-type buried layer 2 is formed thereon with an $n^-$-type silicon epitaxial layer 4 serving as a collector region. The $n^-$-type silicon epitaxial layer 4 is isolated by an oxide film 5 which is formed by local oxidation of silicon (hereinafter referred to as a LOCOS oxide film). The $n^+$-type buried layer 2 is also formed thereon with an $n^+$-type collector arsenic diffusion layer 6 which is isolated from the $n^-$-type silicon epitaxial layer 4 by the LOCOS oxide film 5. The $n^+$-type collector arsenic diffusion layer 6 is provided thereon with a collector contact. The layer 6 is, then, heavily doped with an arsenic dopant and diffused to support a high dopant concentration thereby reducing a collector resistance. A non-self-aligned p-type intrinsic base layer 7 including SiGe is provided on the $n^-$-type silicon epitaxial layer 4. A polycrystalline SiGe layer 8 is formed on the LOCOS oxide film 5. An n-type emitter region 11 is formed in a surface region of the intrinsic base layer 7. The emitter region 11 is made into contact with an emitter contact made of an aluminum system metal through a polycrystalline silicon layer 13 of the same conductive type. This permits the emitter region 11 to be free from a damage by contacting with the emitter contact of metal, although the emitter region 11 is very thin. A base contact 14 contacts with the intrinsic base layer 7. A $p^+$-type silicon layer 9 is formed in a surface of the $n^-$-type silicon epitaxial layer 4. The $p^+$-type silicon layer 9 is also provided directly under the base contact 14 through the base layer 7 thereby permitting the thin p-type intrinsic base layer 7 damaged by contacting with the base contact 14 to be covered. The base, emitter and collector contacts are surrounded by silicon oxide films 10 and 12.

Figure 4:
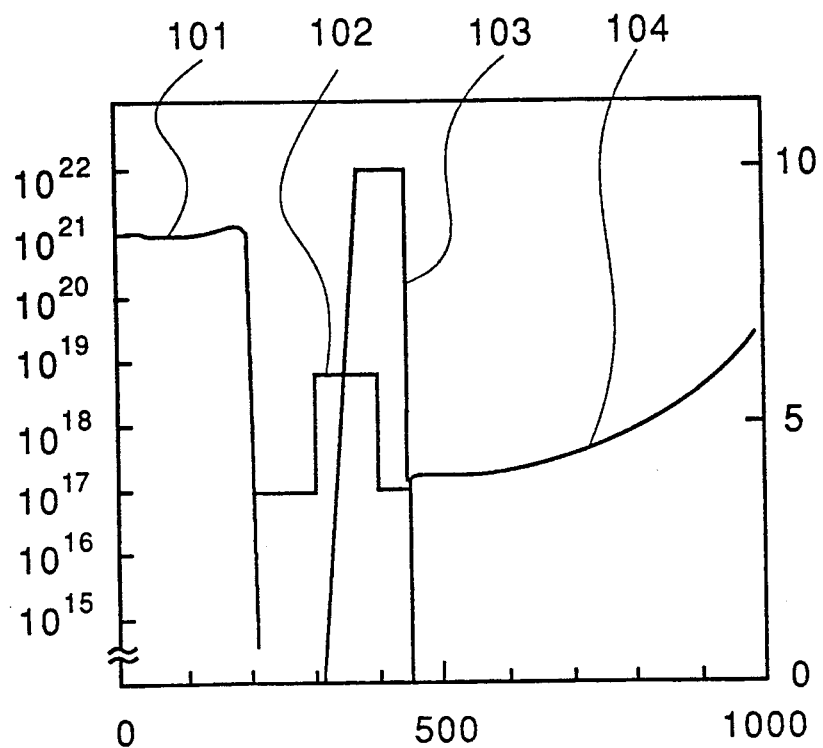
FIG. 4 is a diagram illustrative of dopant profiles in the emitter-base-collector regions and the mole-percent of germanium prior to a heat treatment for dopant diffusion in the device of FIG. 3.

FIG. 4 illustrates a doping profile prior to a heat treatment for diffusion of the arsenic dopant into the emitter region 11. An arsenic concentration 101 in the doped polysilicon remains at approximately $1\times 10^{21}$ atoms·cm$^{-3}$ by a depth of 200 nm. An boron concentration 102 remains at approximately $1\times 10^{17}$ atoms·cm$^{-3}$ in the range of the depth from 200 nm to 300 nm and at approximately $5\times 10^{18}$ atoms cm$^{-3}$ in the depth from 300 nm to 400 nm and at approximately $1\times 10^{17}$ atoms cm$^{-3}$ in the depth from 400 nm to 450 nm. A germanium concentration 103 increases from 0% to 10% in the depth range from 300 nm to 350 nm and remains at 10% in the depth range from 350 nm to 450 nm. A phosphorus concentration 104 increases from approximately $1\times 10^{17}$ atoms·cm$^{-3}$ to approximately $1\times 10^{19}$ atoms·cm$^{-3}$. It is considerable that at the base-collector p-n junction of the depth of 450 nm, the phosphorus concentration 104 is at least higher than the boron concentration 102. It is further considerable that the phosphorus concentration 104 has a positive gradient.

Figure 5:
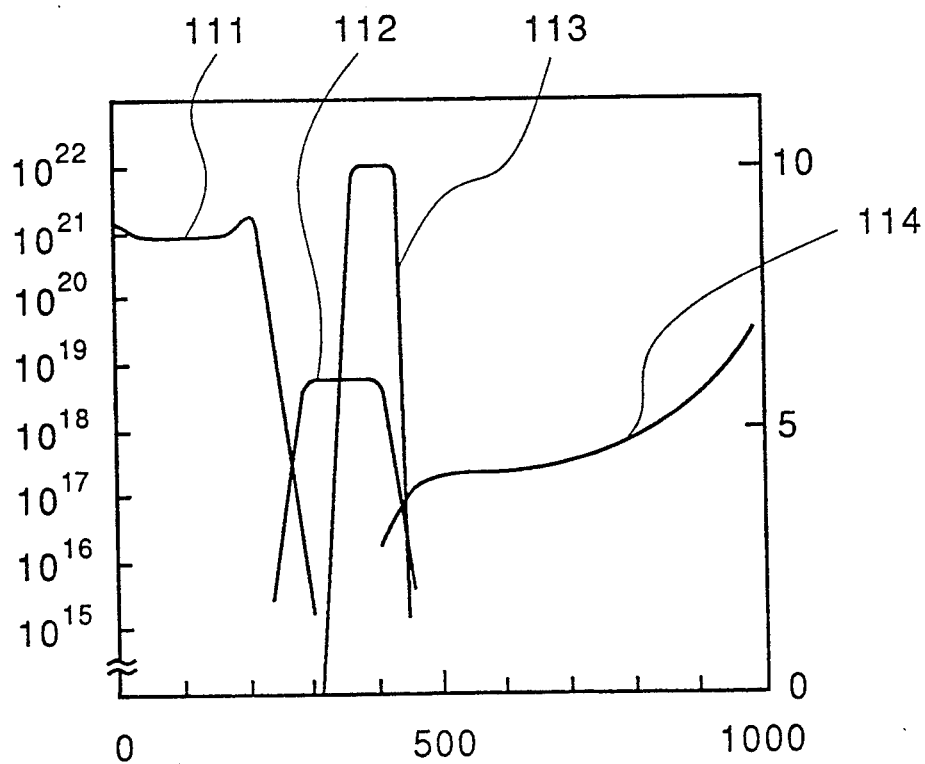
FIG. 5 is a diagram illustrative of dopant profiles in the emitter-base-collector regions and the mole-percent of germanium after a heat treatment for dopant diffusion in the device of FIG. 3.

FIG. 5 illustrates a doping profile after the heat treatment for pushing the arsenic dopant into the emitter region 11. As compared with the profiles of FIG. 4, it is understood that the profiles of boron and arsenic 112 and 111 are varied due to the heat treatment. The base-emitter p-n junction exists in the silicon region. The base-collector p-n junction remains in the silicon germanium region because the phosphorus concentration 114 is at least higher than the boron concentration 112 at the p-n junction thereof and has the positive gradient. Those permits preventing the base-collector p-n junction formed in the silicon region at the collector side thereby providing an optimum potential profile without a potential barrier for carriers.

Figure 6:
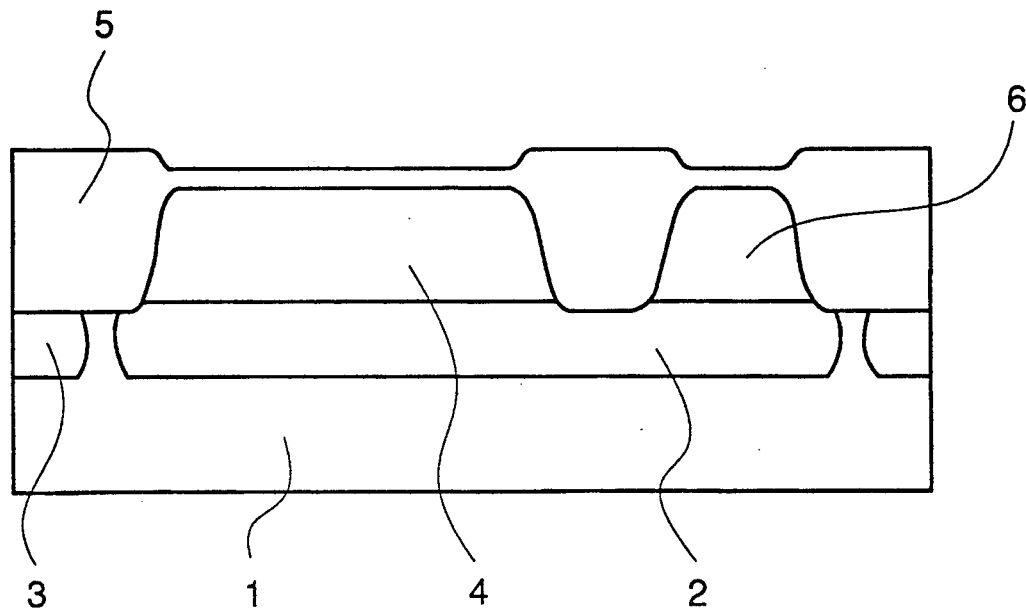
FIGS. 6 to 8 are fragmentary cross sectional elevation views illustrative of sequential processes involved in a fabrication method of the device of FIG. 3.

Fabrication processes of the device of the first embodiment will now be described. Referring to FIG. 6, the p$^-$-type silicon substrate 1 is subjected to the arsenic dopant diffusion by using a mask so that the n$^+$-type buried layer 2 is formed in the surface of the p$^-$-type silicon substrate 1. Further, the p$^-$-type silicon substrate 1 is subjected to the boron dopant diffusion by using a mask so that the p$^+$-type buried layer 3 is formed in the surface of the p$^-$-type silicon substrate 1. The p$^+$-type buried layer 3 serves as a channel stopper. Subsequently, an epitaxial growth is accomplished to form the n$^-$-type silicon epitaxial layer 4 having a phosphorus dopant concentration of approximately $1\times 10^{17}$ atoms·cm$^{-3}$ and a thickness of approximately 0.7 micrometers. Further, the LOCOS oxide film 5 is formed on the device by using a silicon nitride film patterned as a mask, after which the silicon nitride film is removed with H$_3$PO$_4$ acid. After that, a silicon nitride film is deposited on the device, followed by patterning. The arsenic dopant diffusion is accomplished by using the silicon nitride film patterned as a mask so that the n$^+$-type collector phosphorus diffusion layer 6 is formed. Surfaces of the diffused silicon regions 4 and 6 are oxidized, followed by removing the silicon nitride film.

Figure 7:
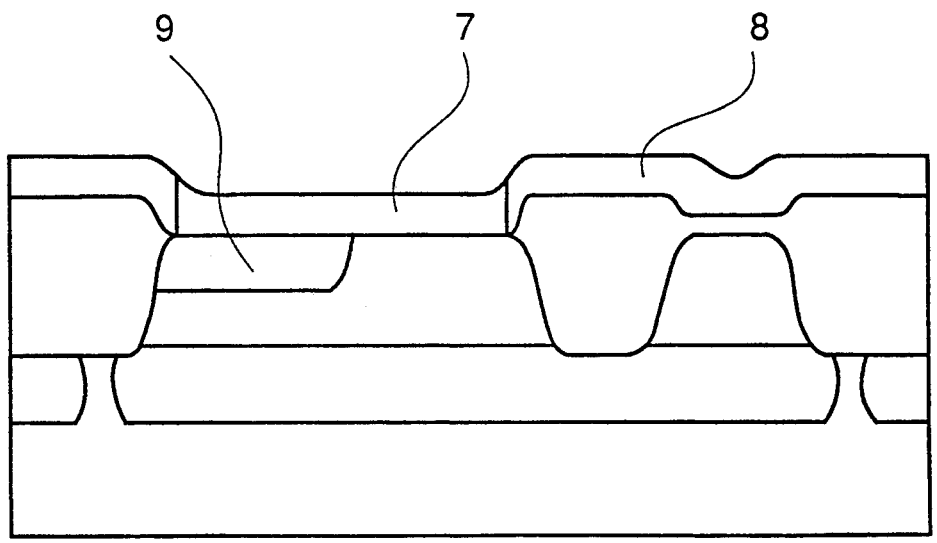

Referring to FIG. 7, a boron ion-implantation is accomplished by employing a photoresist as a mask on condition of 30 KeV, $5\times 10^{15}$ atoms·cm$^{-3}$. After removing the photoresist, a heat treatment is accomplished at a temperature of 900 degrees for thirty minutes in a nitrogen atmosphere N$_2$ so that the base contact p$^+$-type layer 9 is formed in a part of the n$^-$-type silicon epitaxial layer 4. The photoresist is subjected to re-patterning by which the silicon oxide film covering the base contact p$^+$-type layer 9 and the n$^-$-type silicon epitaxial layer 4 is removed, followed by removing the re-patterned photoresist.

Subsequently, the base epitaxial layer 7 is grown on the base contact p$^+$-type layer 9 and the n$^-$-type silicon epitaxial layer 4 by introducing the water into a molecular beam epitaxial (MBE) growth system. Concurrently, the polycrystalline layer 8 is deposited due to a non-selective growth by using a solid source. In replacement of this method, a selective epitaxial growth such as a gas source molecular beam epitaxy may be accomplished thereby resulting in no deposition of polycrystalline layer 8 on the oxide film 5 but the growth of the base epitaxial layer 7.

In the case of the gas source molecular beam epitaxy at a growth temperature of 600 degrees, doping profiles in the base layer prior to the heat treatment for diffusion of the arsenic dopant into the emitter region 11 are as follows. A boron concentration is approximately $5\times 10^{16}$ atoms·cm$^{-3}$ in the range of 100 angstroms and approximately $5\times 10^{18}$ atoms·cm$^{-3}$ in the range of 600 angstroms and approximately $1\times 10^{16}$ atoms·cm$^{-3}$ in the range of 100 angstroms. A germanium concentration increases form 0% to 10% in the depth range of 300 angstroms and remains at 10% in the depth range of 200 angstroms.

Figure 8:
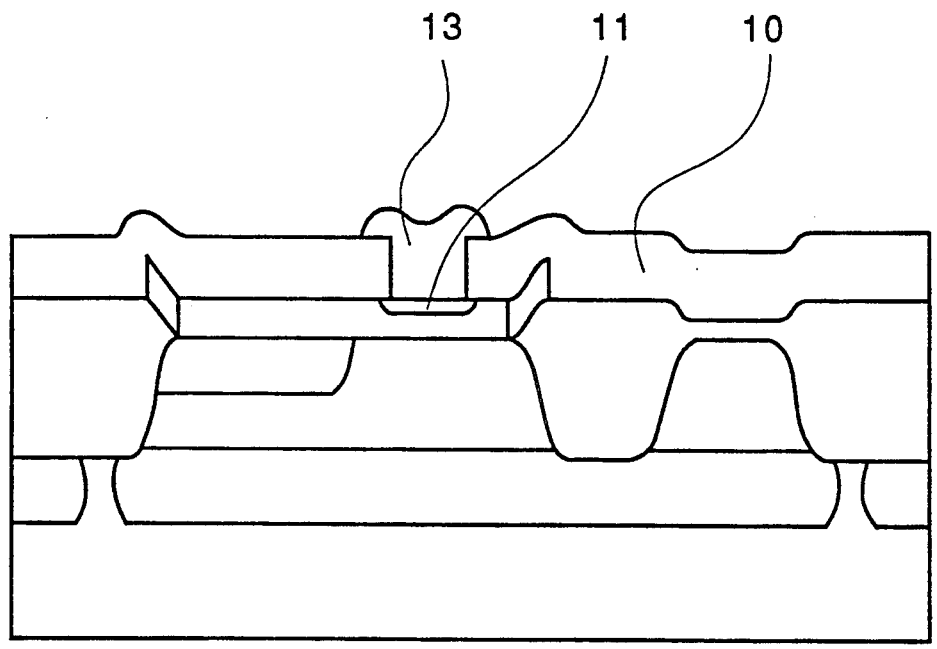

Referring to FIG. 8, a silicon oxide film 10 is formed to cover a surface of the device, after which a lithography and etching are in turn accomplished to form an opening in the silicon oxide film 10. Polycrystalline silicon doped with an arsenic dopant is deposited in the opening, followed by a lithography and patterning so that the polycrystalline silicon region 13 is formed. Subsequently, a lamp anneal as a heat treatment is accomplished at a temperature of 900 degrees for ten seconds so that the arsenic dopant in the polycrystalline silicon region 13 is diffused into the base region 7 thereby resulting in a formation of the emitter region 11 of a monocrystal.

Further, the silicon oxide film 12 is deposited on the device. Contact holes are formed in the silicon oxide film 12, followed by formations of emitter, base and collector contacts made of an aluminum system metal.

Figure 9:
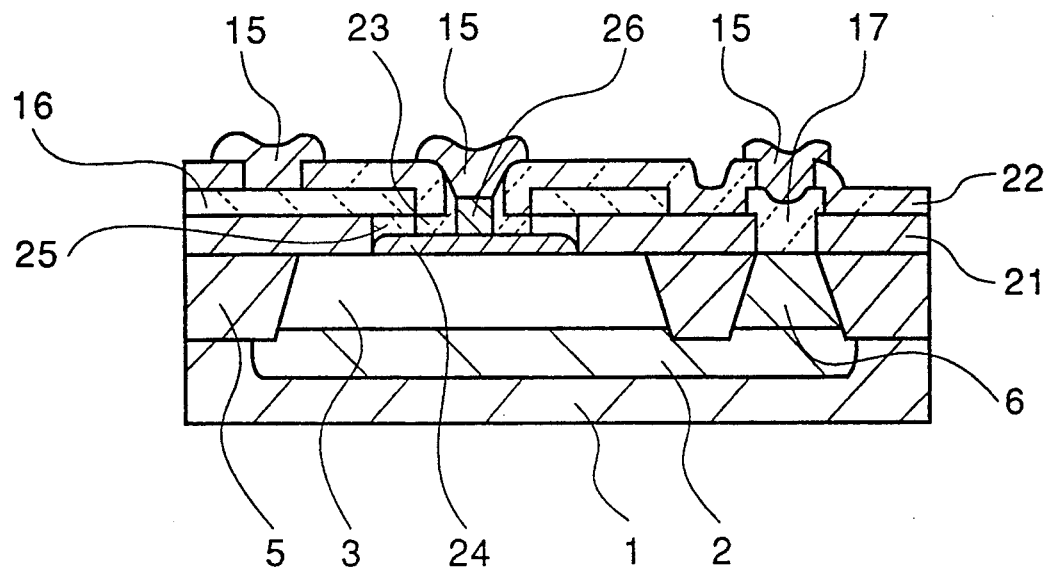
FIG. 9 is a fragmentary cross sectional elevation view illustrative of a novel self-aligned epitaxial intrinsic base heterojunction bipolar transistor of a second embodiment according to the present invention.

A second embodiment of the present invention will now be described. Referring to FIG. 9, the device includes a p$^-$-type silicon substrate 1 which possesses a resistivity of approximately 10 ohms cm at a room temperature. The p$^-$-type silicon substrate 1 has a plane (100). The p$^-$-type silicon substrate 1 includes an n$^+$-type buried layer 2 at its upper portion. The n$^+$-type buried layer 2 is subjected to an arsenic diffusion. The n$^+$-type buried layer 2 is formed thereon with an n$^-$-type silicon epitaxial layer 3 serving as a collector region. The n$^-$-type silicon epitaxial layer 3 has a doping concentration of approximately $5\times 10^{15}$ atoms·cm$^{-3}$ and a thickness of approximately 1.8 micrometers. The n$^-$-type silicon epitaxial layer 3 is also isolated by an LOCOS oxide film 5. The n$^+$-type buried layer 2 is also formed thereon with an n$^+$-type collector phosphorus diffusion layer 6 which is isolated form the n$^-$-type silicon epitaxial layer 3 by the LOCOS oxide film 5. The n$^+$-type collector phosphorus diffusion layer 6 is connected with a collector contact 15 through a polycrystalline silicon region 17. The layer 6 is, then, heavily doped with an phosphorus dopant and diffused to support a high dopant concentration thereby reducing a collector resistance. A p-type intrinsic base layer 24 of monocrystalline silicon is provided on the n$^-$-type silicon epitaxial layer 3. The intrinsic base layer 24 has a doping concentration of approximately $3\times 10^{18}$ atoms·cm$^{-3}$ and a thickness of 600 angstroms. The intrinsic base layer 24 is connected through an external base region 25 of polycrystalline silicon to a base contact layer 16 of polycrystalline silicon. The base contact layer 16 is isolated from the n⁻-type silicon epitaxial layer 3 by a silicon nitride film 21. An n-type emitter region 16 of monocrystalline silicon is provided on the p-type intrinsic base layer 24. A base contact 15 is provided on the base contact layer 16. An emitter contact is provided on the emitter region 26 of monocrystalline silicon. The emitter region 26 of monocrystalline silicon is insulated from the external base region 25 by a silicon oxide film 23. The emitter, base and collector contacts 15 are made of an aluminum system metal and are respectively insulated by a silicon oxide film 22.

Figure 10:
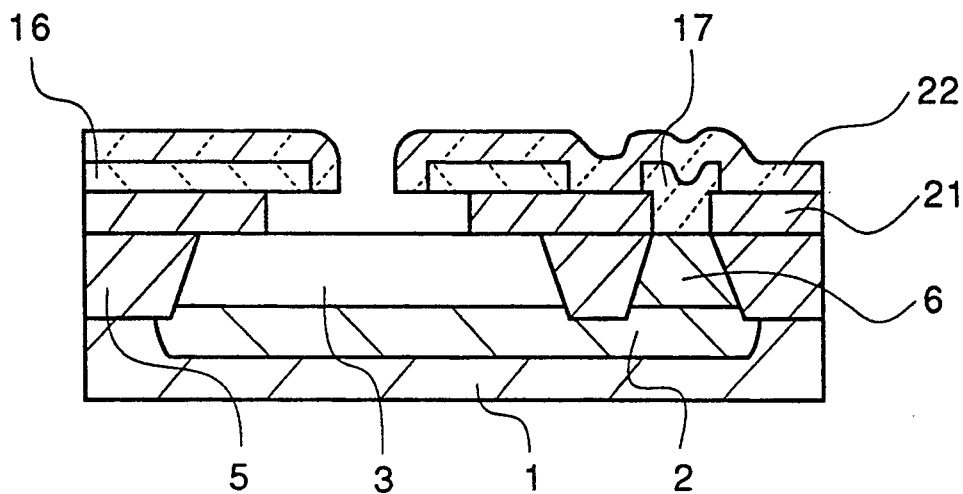
FIGS. 10 to 13 are fragmentary cross sectional elevation views illustrative of sequential processes involved in a fabrication method of the device of FIG. 9.

Fabrication processes of the device of the second embodiment are as follows. Referring to FIG. 10, the base contact layer 16 and the silicon oxide film 22 are subjected to dry etching by using a photoresist as a mask to form an opening at an emitter region. After that, the silicon oxide film 22 is deposited under a reduced pressure so that the silicon oxide film 22 is extended at a side wall of the base contact layer 16. Dry etching is then accomplished to remove the silicon oxide film on the bottom of the opening. The silicon nitride film 21 isolates the base contact layer 16 from the n⁻-type epitaxial silicon layer 3. The silicon nitride film 21 having a thickness of approximately 2000 angstroms is etched by use of $H_3PO_4$ acid so that the n⁻-type silicon epitaxial layer 3 is exposed. Further, a bottom surface of the base contact layer 16 is exposed up to approximately 2000 angstroms from an edge portion of the extended silicon oxide film 22 to the opening.

Figure 11:
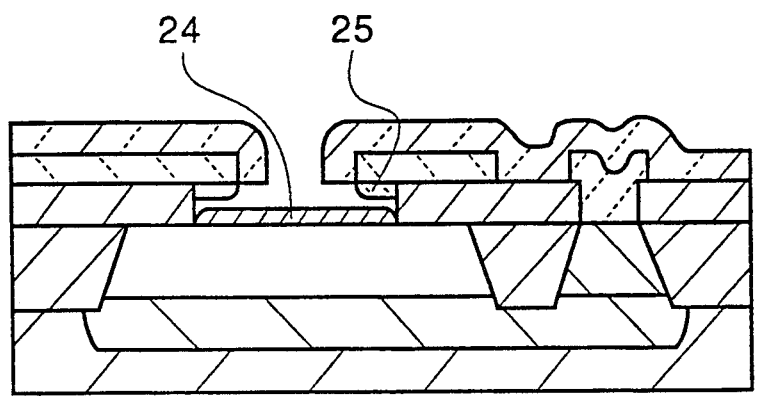

Referring to FIG. 11, the opening of the device is subjected to a molecular beam epitaxial growth treatment by which the intrinsic base layer 24 of monocrystalline silicon is selectively grown only on the exposure region of the n⁻-type silicon epitaxial layer 3. Concurrently, the external base region 25 of polycrystalline silicon is grown only on the exposure bottom surface of the base contact layer 16.

Figure 12:
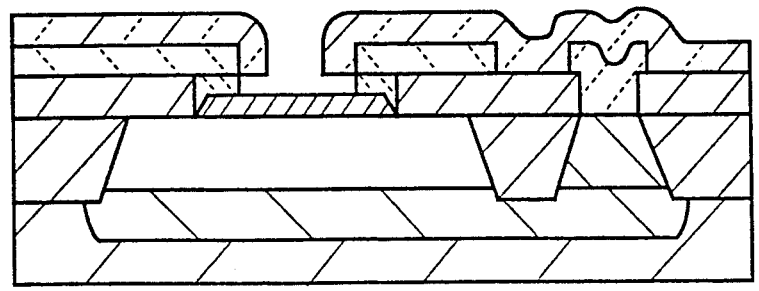

Referring to FIG. 12, subsequently, the intrinsic base layer 24 of monocrystalline silicon and the external base region of polycrystalline silicon are respectively formed so that both contact with one another. The base contact layer 16 of polycrystalline silicon is, therefore, connected to the intrinsic base layer 24 of monocrystalline silicon through the external base region 25 of polycrystalline silicon. Actually, the growth of both the intrinsic base layer 24 and the external base region 25 is accomplished on condition of a substrate temperature of 560 degrees, $Si_2H_6$ source gas, $2\times10^{-5}$ Torr of degree of vacuum and approximately 8.5 minutes. These results are that the thicknesses of the intrinsic base layer 24 and the external base region 25 are approximately 600 angstroms and approximately 500 angstroms respectively.

In this embodiment, although the molecular beam epitaixal method is accomplished, a low pressure chemical vapor deposition method under a several Torr pressure or in the range of pressure from $1\times10^{-1}$ to $1\times10^{-5}$ is available.

Figure 13:
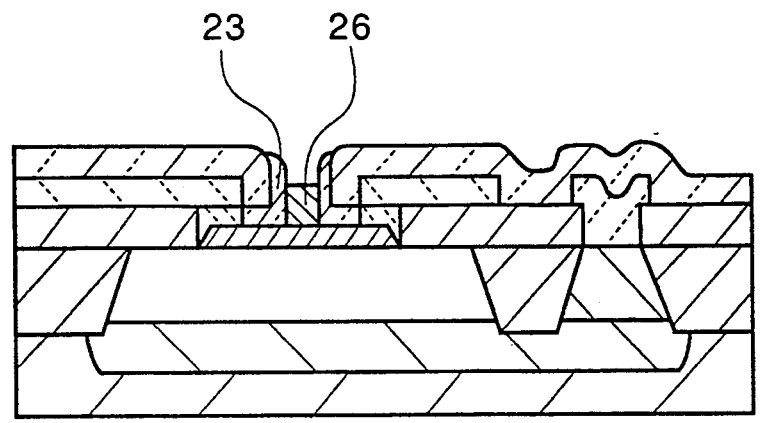

Referring to FIG. 13, subsequently the silicon oxide film 23 is deposited by the low pressure chemical vapor deposition, after which an etch back of the silicon oxide film 23 is accomplished by dry etching so as to have the silicon oxide film 23 remain at the side wall of the external base region 25. An n-type emitter region 26 of moncrystalline silicon is grown on an exposure area of the intrinsic base region so that the n-type emitter region 26 is surrounded with the silicon oxide film 23. The n-type emitter region 26 also has a doping concentration of approximately $1\times10^{19}$ atoms·cm⁻³.

Further, openings are formed in the silicon oxide film 22 before an evaporation of an aluminum system metal is accomplished thereby resulting in a deposition of the aluminum system metal on an entire surface of the device. After that, a lithography is accomplished so that the deposited aluminum system metal remains at the opening thereby resulting in formations of emitter, base and collector contacts 15.

Figure 14:
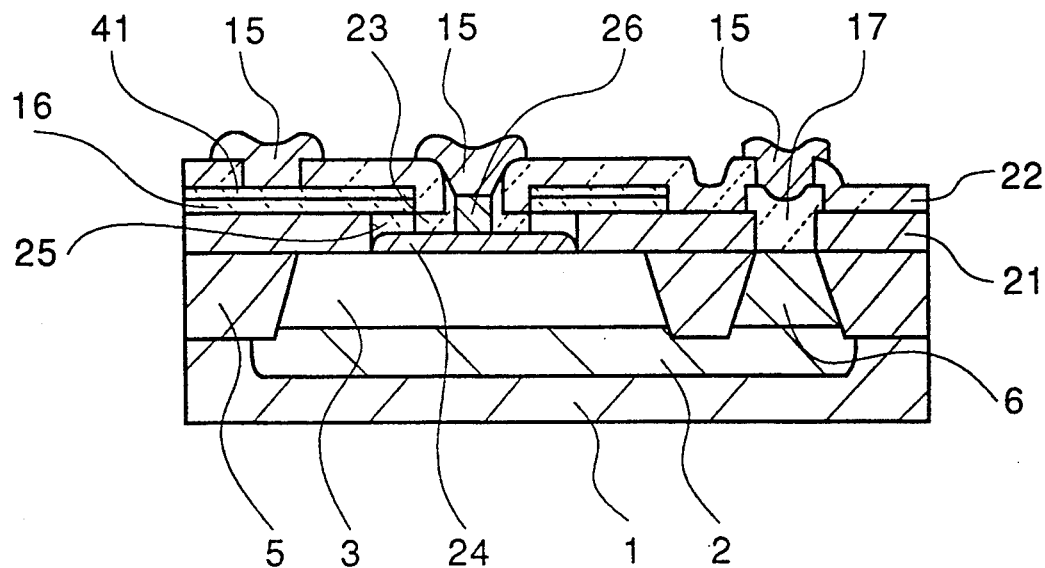
FIG. 14 is a fragmentary cross sectional elevation view illustrative of a novel self-aligned epitaxial intrinsic base heterojunction bipolar transistor of a third embodiment according to the present invention.

A third embodiment of the present invention will now be described with reference to FIG. 14. In this embodiment, the structure of the device is analogous to that of the second embodiment illustrated in FIG. 9, except for the base.

An intrinsic base layer 24 and an external base region 25 are formed by the same method as the first embodiment. Further, the base contact layer of polycrystalline silicon comprises a titanium silicide $TiSi_2$ film 41 and a polycrystalline silicon film 16 thereby reducing a base resistance. With regard to the fabrication of the titanium silicide $TiSi_2$ film 41, titanium is deposited on the polycrystalline silicon film 16 by sputtering prior to a heat treatment so that the titanium silicide film 41 is formed. When the titanium silicide film 41 has a thickness of approximately 1000 angstroms and the polycrystalline silicon film 16 has a thickness of approximately 1500 angstroms, a sheet resistance is of the base contact layers 16 and 41 in the range between 2 and 3 ohms per square. In contrast, when the base contact layer comprises a single polycrystalline silicon film having a thickness of approximately 2500 angstroms, the sheet resistance of the base contact layer is in the range between 8 and 9 ohms per square. It is therefore understood that the sheet resistance of the double layers 41 and 16 is smaller than that of the single polycrystalline silicon layer.

Figure 15:
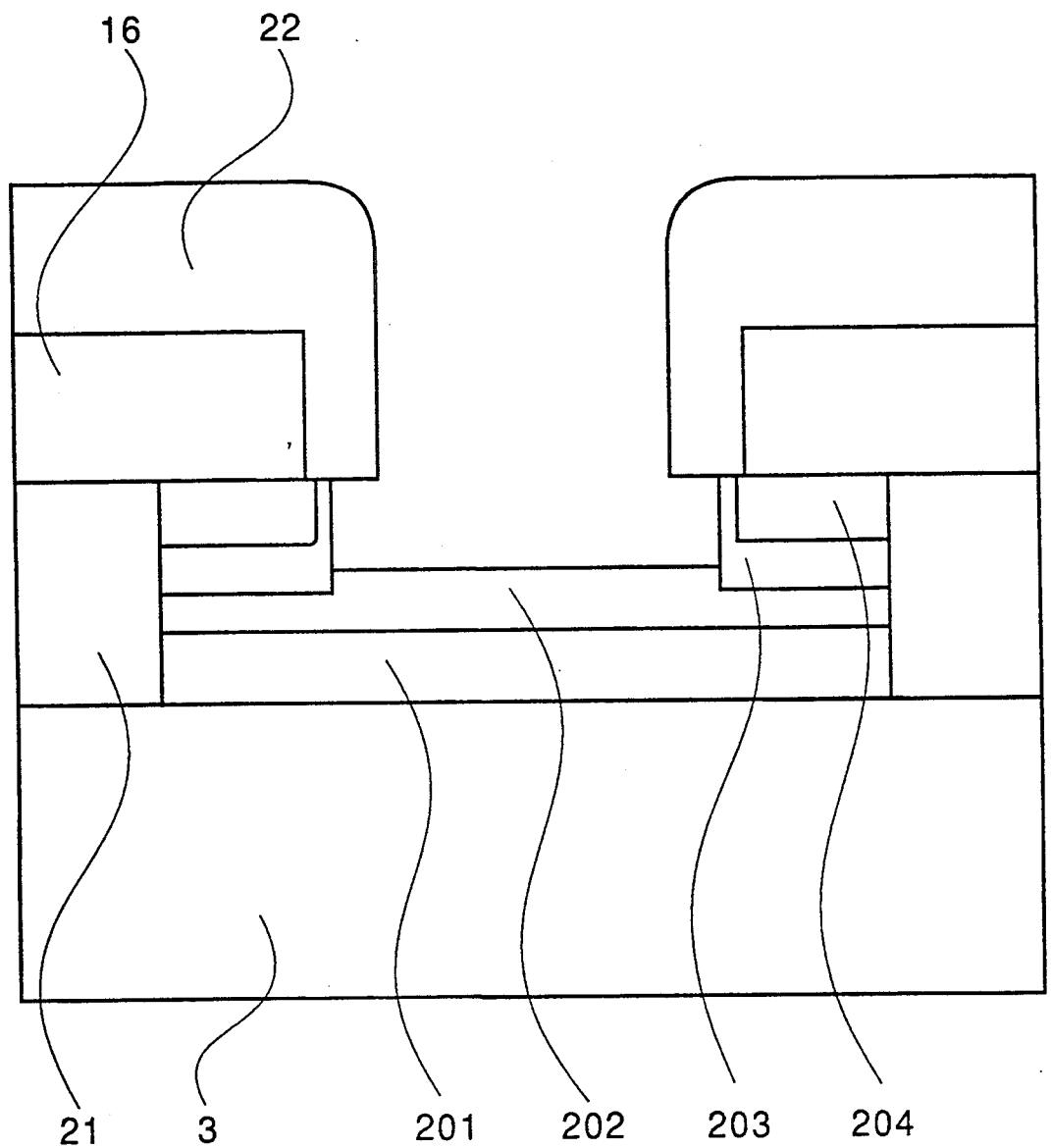
FIGS. 15 is an enlarged cross sectional elevation view illustrative of a novel self-aligned epitaxial intrinsic base heterojunction bipolar transistor of according to the present invention.

FIG. 15 illustrates a structure of the selective epitaxial intrinsic base layer and the external base region which is selectively deposited. The intrinsic base layer has a double layer structure comprising both a p-type mixed monocrystalline silicon germanium layer 201 and a p-type monocrystalline silicon layer 202. The external base region also has a double layer structure comprising both a p-type polycrystalline silicon layer 203 and a p-type polycrystalline silicon germanium layer 204.

Figure 16:
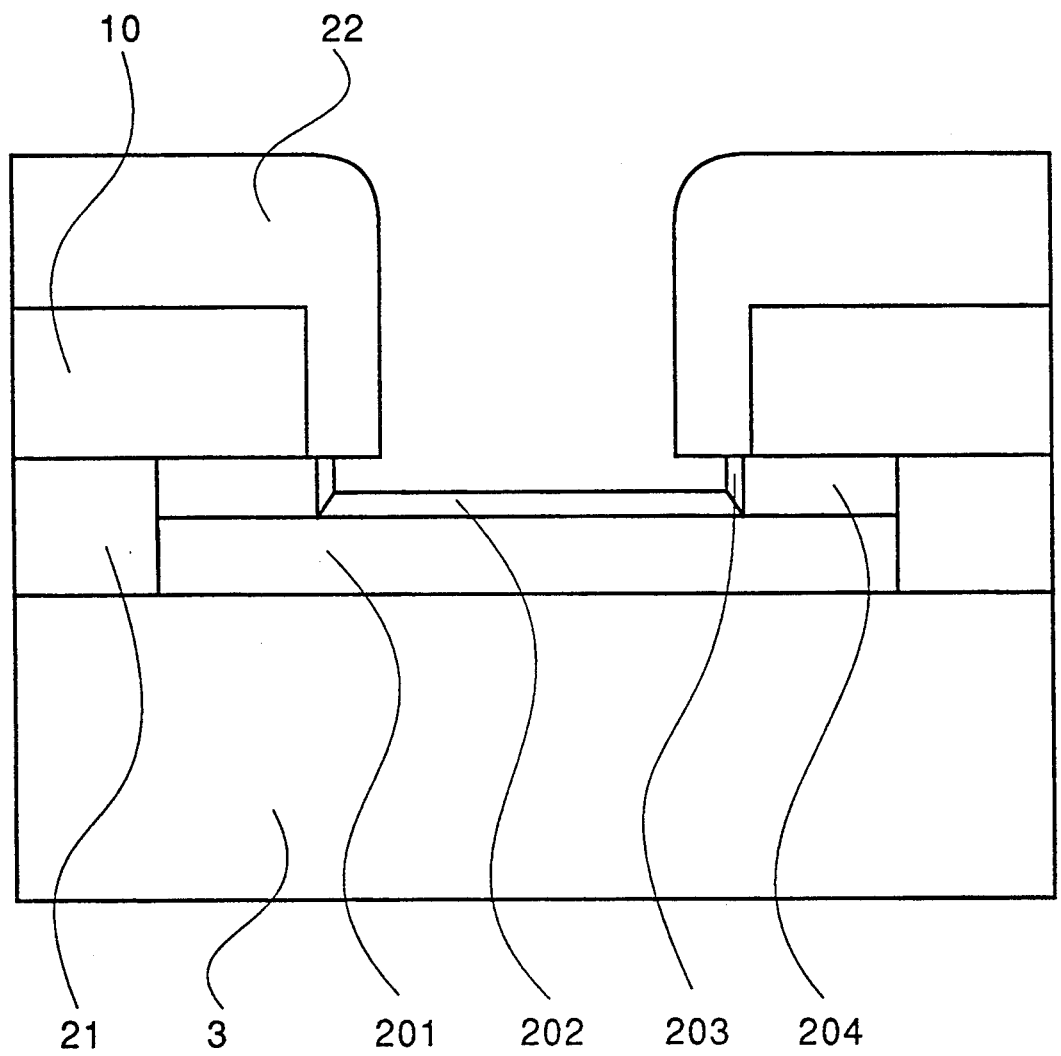
FIGS. 16 is an enlarged cross sectional elevation view illustrative of novel self-aligned epitaxial intrinsic base heterojunction bipolar transistor of a fourth embodiment according to the present invention.

FIG. 16 illustrates another structure of the selective epitaxial intrinsic base layer and the external base region which is selectively deposited as a fourth embodiment of the present invention. In this case, a p-type polycrystalline silicon germanium layer 204 is sandwiched with a p-type mixed monocrystalline silicon germanium layer 201 and the base contact layer 10. A p-type monocrystalline silicon layer 202 overlays on the p-type mixed monocrystalline silicon germanium layer 201. A p-type polycrystalline silicon layer 203 covers a side wall of the p-type polycrystalline silicon germanium layer 204.

Figure 17:
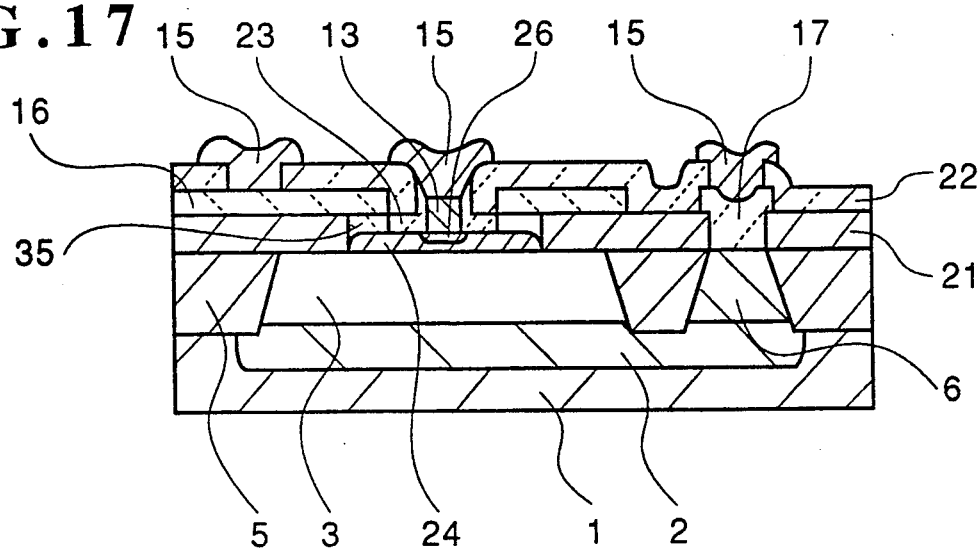
FIG. 17 is a fragmentary cross sectional elevation view illustrative of a novel self-aligned epitaxial intrinsic SiGe base heterojunction bipolar transistor of a fifth embodiment according to the present invention.

A fifth embodiment of the present invention will now be described with reference to FIG. 17. The structure of the device is analogous to that of the second embodiment illustrated in FIG. 9, but the emitter region 26 is formed in the surface of the intrinsic base layer 24. The emitter region 26 is formed by a diffusion of the arsenic dopant from the emitter contact layer 13 of polycrystalline silicon into the intrinsic base layer 24. In this embodiment, although the emitter contact layer 13 of polycrystalline silicon is formed by a selective deposition, a normal blanket growth prior to patterning by a photoresist is available.

Figure 18:
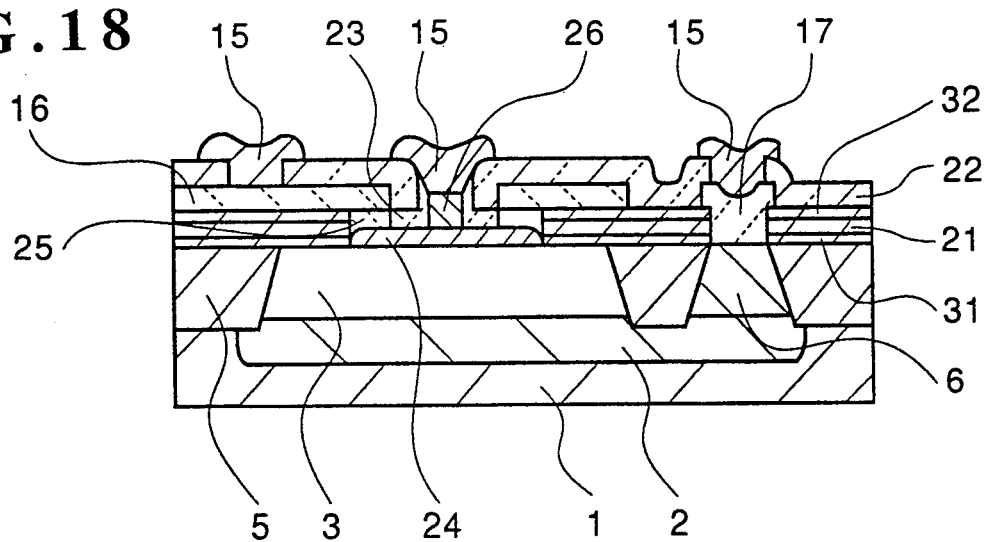
FIG. 18 is a fragmentary cross sectional elevation view illustrative of a novel self-aligned epitaxial intrinsic base heterojunction bipolar transistor of a sixth embodiment according to the present invention.

A sixth embodiment of the present invention will be described with reference to FIG. 18. The structure of the device is analogous to that of the second embodiment illustrated in FIG. 9, except the insulation layers isolating the base contact layer 16 from the n⁻-type silicon epitaxial layer 3. The insulation layers have a sandwiched structure of a silicon nitride film 21 between two silicon oxide films 31 and 32 thereby providing a following advantage. In the fabrication processes, when the silicon nitride film 22 is subjected to side-etching by hot $H_3PO_4$ acid, the base contact layer 16 and the silicon epitaxial layer 3 are respectively protected from a damage by hot $H_3PO_4$ acid with the silicon oxide films 31 and 32 thereby permitting the selective epitaxial growth of the base layer 24.

Figure 19:
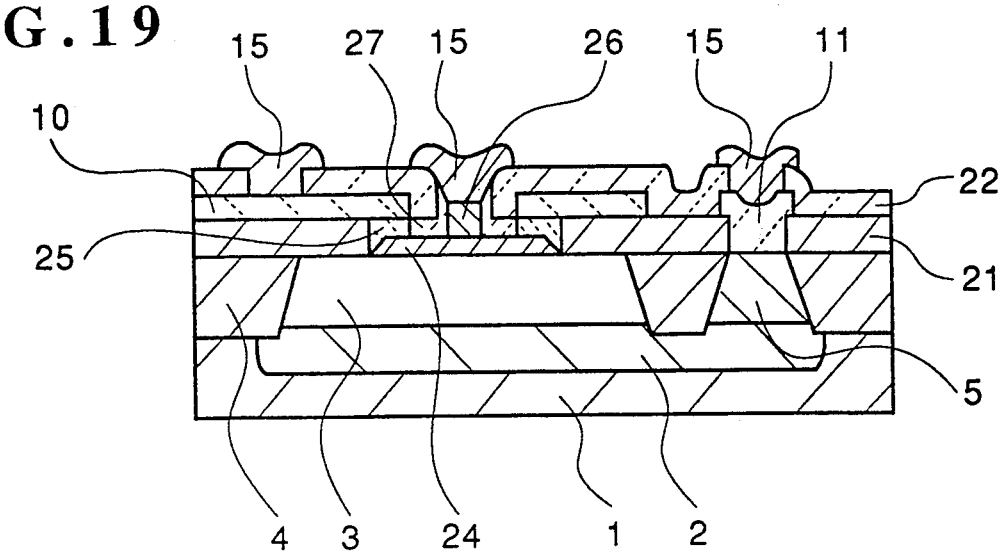
FIG. 19 is a fragmentary cross sectional elevation view illustrative of a novel self-aligned epitaxial intrinsic base heterojunction bipolar transistor of a seventh embodiment according to the present invention.

A seventh embodiment of the present invention will be described with referring to FIG. 19. The structure of the device is analogous to that of the second embodiment illustrated in FIG. 9, except an insulation film 27 surrounding the emitter region 26 of polycrystalline silicon. The insulation layer 27 has a sandwiched structure of a silicon nitride film between two silicon oxide films thereby providing a following advantage. In the fabrication processes, when the triple insulation film is subjected to an etch back, the sandwiched silicon nitride film may serves as an end-point detection of the etch-back treatment so that the intrinsic base layer is undamaged.

Although the above embodiments relates to the n-p-n bipolar transistor, the p-n-p bipolar transistor is of course, available. The modifications of the dopant concentration, dimension, material may also be varied by matching the conditions.

Whereas modifications of the present invention will no doubt be apparent to a person of ordinary skill in the art, it is to be understood that the embodiments shown and described by way of illustration are by no means intended to be considered in a limiting sense. Accordingly, it is to be intended by the claims to cover all modifications of the invention which fall within the sprit and scope of the invention.

What is claimed is:

1. A heterojunction bipolar transistor comprising:
an emitter region of silicon doped with a first conductive type dopant;
a base layer doped with a second conductive type dopant which includes both a first layer made of a mixed monocrystalline silicon-germanium alloy and a second layer made of monocrystalline silicon, said second layer being in contact with said emitter region; and
a collector region of monocrystalline silicon doped with a first conductive type dopant, said collector region comprising an island region selectively formed in a silicon monocrystalline substrate, said collector region being in contact with said first layer of said base layer, so that an emitter side heterojunction of silicon and silicon germanium exists in said base layer and a collector side heterojunction of silicon and silicon germanium exists in said collector region, said collector region including a layer made of a mixed monocrystalline silicon germanium alloy at a surface region thereof, said layer being doped with said first conductive type dopant.

2. A heterojunction bipolar transistor as claimed in claim 1, wherein said first layer of said base layer comprises a higher dopant concentration region at an emitter side and a lower dopant concentration region at a collector side and said second layer of said base layer has a lower dopant concentration than that of said higher dopant concentration region of said first layer.

3. A heterojunction bipolar transistor as claimed in claim 1, wherein said emitter region is formed in a surface of said base layer and said emitter region is connected to an emitter contact made of aluminum through an emitter contact layer of polycrystalline silicon.

4. A heterojunction bipolar transistor as claimed in claim 3, further comprising a base contact layer of silicon doped with a second conductive type dopant formed in a surface of said collector region, said base contact layer existing at least under a base contact made of aluminum through said base layer.

5. A heterojunction bipolar transistor as claimed in claim 1, further comprising:
an external base layer on said base layer, said external base layer being doped with said second conductive type dopant;
a base contact layer doped with said second conductive type dopant, said base contact layer being on said external base layer and being provided thereon with a base contact made of aluminum,
a first insulation layer separating said base contact layer from said collector region; and
a second insulation layer separating said emitter region from said external base layer and said base contact layer.

6. A heterojunction bipolar transistor as claimed in claim 5, wherein said base contact layer comprises a polycrystalline silicon layer.

7. A heterojunction bipolar transistor as claimed in claim 5, wherein said base contact layer comprises both a polycrystalline silicon layer and a titanium silicide layer.

8. A heterojunction bipolar transistor as claimed in claim 5, wherein said first insulation layer comprises a silicon nitride layer.

9. A heterojunction bipolar transistor as claimed in claim 5, wherein said first insulation layer comprises a silicon nitride layer sandwiched with silicon oxide layers.

10. A heterojunction bipolar transistor as claimed in claim 5, wherein said second insulation layer comprises a silicon oxide layer.

11. A heterojunction bipolar transistor as claimed in claim 5, wherein said second insulation layer comprises a silicon nitride layer sandwiched with silicon oxide layers.

12. A heterojunction bipolar transistor as claimed in any one of claims 1, 2 and 3, wherein said first conductive type dopant in said collector region is phosphorus.

13. A heterojunction bipolar transistor as claimed in any one of claims 1, 2 and 3, wherein said first conductive type dopant in said emitter region is arsenic.

14. A heterojunction bipolar transistor as claimed in any one of claims 1, 2 and 3, wherein said second conductive type dopant in said base layer is boron.

15. A heterojunction bipolar transistor as claimed in any one of claims 1, 2 and 3, wherein said monocrystalline silicon substrate has a plane (100).

16. A heterojunction bipolar transistor comprising:

an emitter region of silicon doped with a first conductive type dopant;

a base layer doped with a second conductive type dopant which includes both a first layer made of a mixed monocrystalline silicon-germanium alloy and a second layer made of monocrystalline silicon, said second layer being in contact with said emitter region;

a collector region of monocrystalline silicon doped with a first conductive type dopant, said collector region comprising an island region selectively formed in a silicon monocrystalline substrate, said collector region being in contact with said first layer of said base layer, so that an emitter side heterojunction of silicon and silicon germanium exists in said base layer and a collector side heterojunction of silicon and silicon germanium exists in said collector region;

an external base layer on said base layer, said external base layer being doped with said second conductive type dopant;

a base contact layer doped with said second conductive type dopant, said base contact layer being on said external base layer and being provided thereon with a base contact made of aluminum;

a first insulation layer separating said base contact layer from said collector region; and a second insulation layer separating said emitter region from said external base layer and said base contact layer;

said external base layer comprising a polycrystalline silicon layer in contact with said base layer and a mixed polycrystalline silicon germanium layer in contact with said base contact layer.

17. A heterojunction bipolar transistor comprising:

an emitter region of silicon doped with a first conductive type dopant;

a base layer doped with a second conductive type dopant which includes both a first layer made of a mixed monocrystalline silicon-germanium alloy and a second layer made of monocrystalline silicon, said second layer being in contact with said emitter region;

a collector region of monocrystalline silicon doped with a first conductive type dopant, said collector region comprising an island region selectively formed in a silicon monocrystalline substrate, said collector region being in contact with said first layer of said base layer, so that an emitter side heterojunction of silicon and silicon germanium exists in said base layer and a collector side heterojunction of silicon and silicon germanium exists in said collector region;

an external base layer on said base layer, said external base layer being doped with said second conductive type dopant;

a base contact layer doped with said second conductive type dopant, said base contact layer being on said external base layer and being provided thereon with a base contact made of aluminum;

a first insulation layer separating said base contact layer from said collector region; and a second insulation layer separating said emitter region from said external base layer and said base contact layer;

said external base layer comprising a polycrystalline silicon germanium layer sandwiched with both said base contact layer and said base layer, and a polycrystalline silicon layer on a said wall of said polycrystalline silicon germanium layer.

* * * * *